US005169491A

United States Patent [19]

Doan

[11] Patent Number: 5,169,491

[45] Date of Patent: Dec. 8, 1992

[54] METHOD OF ETCHING $SIO_2$ DIELECTRIC LAYERS USING CHEMICAL MECHANICAL POLISHING TECHNIQUES

[75] Inventor: Trung T. Doan, Boise, Id.

[73] Assignee: Micron Technology, Inc., Boise, Id.

[21] Appl. No.: 737,376

[22] Filed: Jul. 29, 1991

[51] Int. Cl.[5] ..... H01L 21/00

[52] U.S. Cl. ..... 156/636; 437/228; 437/235

[58] Field of Search ..... 437/228, 235; 156/636

[56] References Cited

U.S. PATENT DOCUMENTS

| | | | |
|---|---|---|---|
| 4,671,851 | 6/1987 | Beyer et al. | 437/67 |
| 4,789,560 | 12/1988 | Yen | 427/96 |
| 4,944,836 | 7/1990 | Beyer et al. | 156/645 |
| 4,956,313 | 9/1990 | Cote et al. | 437/203 |
| 5,096,854 | 3/1992 | Saito et al. | 156/636 |

FOREIGN PATENT DOCUMENTS 61-194748 8/1986 Japan .

OTHER PUBLICATIONS

Translation of Hirobe et al., JP 61-194748.

K. D. Beyer et al., "Glass Planarization by Stop-Layer Polishing", *IBM Technical Disclosure Bulletin*, vol. 27, No. 8, Jan. '85, pp. 4700-4701.

Wolf, "Silicon Processing for the VLSI Era", vol. 2—Process Integration, Lattice Press, pp. 199-239.

*Primary Examiner*—Brian E. Hearn
*Assistant Examiner*—Laura M. Holtzman
*Attorney, Agent, or Firm*—Wells, St. John, Roberts, Gregory & Matkin

[57] ABSTRACT

A method of planarizing $SiO_2$ containing dielectric in semiconductor wafer processing comprising: a) providing a layer of undoped $SiO_2$ atop a wafer; b) depositing a layer of borophosphosilicate glass atop the layer of undoped $SiO_2$; and c) chemical mechanical polishing the borophosphosilicate glass layer selectively relative to the underlying layer of undoped $SiO_2$ layer and using the layer of undoped $SiO_2$ as an effective chemical mechanical polishing end-point etch stop to prevent further etching of the borophosphosilicate glass and produce a substantially planar upper wafer surface of dielectric.

7 Claims, 2 Drawing Sheets

30 55 50 36 36 55 45 38 40 38 34 32 34

METHOD OF ETCHING $SiO_2$ DIELECTRIC LAYERS USING CHEMICAL MECHANICAL POLISHING TECHNIQUES

TECHNICAL FIELD

This invention relates generally to planarization of $SiO_2$ containing dielectric layers on semiconductor wafers

BACKGROUND OF THE INVENTION

With the advent of multi-level interconnection schemes in semiconductor wafer processing and as device dimensions are scaled to sub-micron dimensions, the required degree of planarization is increased. This is the result of the stacking of additional layers on top of one another which produces a more rugged wafer topography. Such can result in poor step coverage of metal lines where they cross over high and steep steps. As well, the rugged topography can exceed depth-of-field limitations in photolithography processes, which can require different mask and etch steps for different elevations in the wafer.

Planarization is typically accomplished by etching interlevel isolating dielectric layers, which are typically comprised predominantly of $SiO_2$. Such techniques include melting and reflow of the dielectric, photoresist-etch-back (REB) and by carefully controlled dielectric deposition techniques which result in a more planar surface. Even with such etch techniques, it is difficult to arrive at a planar upper surface because of a tendency of the low and high regions to etch at the same rate.

Most recently chemical-mechanical polishing (CMP) techniques have been developed which rapidly remove small elevated features without significantly thinning the oxide on the flat or lower areas. CMP processes employ both a chemical and a mechanical component. A rotating or vibrating disk is moved relative to the wafer surface in the presence of a CMP slurry. The slurry includes suspended solids as well as a chemical solution component which attacks the material being polished. The two in combination etch the upper layer of the wafer by chemical and mechanical action which removes the high points much faster than the low points.

CMP is not however without drawbacks. One recognized problem concerns end-point detection during the etch, which is diagrammatically illustrated with reference to FIG. 1. There illustrated is a wafer fragment 10 having field oxide regions 12 and conductive polysilicon runners 14. A first level or layer of insulating dielectric material 16 isolates poly runners 14. An interlevel conductive layer 18 polysilicon is provided atop dielectric layer 16. An isolating dielectric layer 20 is applied atop poly layer 18. Layer 20 has a rugged topography the result of the respective topography of layers 18 and 16. The goal or intent, in this example, is to planarize dielectric layer 20 by a CMP process prior to metallization.

However, a problem of end-point detection renders CMP significantly less accurate than desired. Presently, the degree of dielectric removal with CMP techniques is based solely on time of polishing. Such can result in various degrees of dielectric removal resulting in the end-point being anywhere from as-desired to 3000 Angstroms off. This requires a thicker dielectric layer than would otherwise be required to prevent overetching. Further, it requires a determination after CMP at which level the planarization stopped, as such impacts subsequent processing steps. Planarization techniques including CMP are described at pages 199–239 and the accompany Errata from Wolf, "Silicon Processing for the VLSI Era", Vol. 2—Process Integration, Lattice Press 1990, which is hereby incorporated by reference.

It would be desirable to overcome these and other problems associated with prior art planarization processes.

BRIEF DESCRIPTION OF THE DRAWINGS

One or more preferred embodiments of the invention are described with reference to the accompanying drawings which are briefly described below.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

In accordance with one aspect of the invention, a method of planarizing $SiO_2$ containing dielectric in semiconductor wafer processing comprises the following steps:

providing a layer of undoped $SiO_2$ atop a wafer;

depositing a layer of borophosphosilicate glass (BPSG) atop the layer of undoped $SiO_2$;

chemical mechanical polishing the borophosphosilicate glass layer selectively relative to the underlying layer of undoped $SiO_2$ layer and using the layer of undoped $SiO_2$ as an effective chemical mechanical polishing end-point etch stop to prevent further etching of the borophosphosilicate glass and produce a substantially planar upper wafer surface of dielectric.

In another aspect of the invention, a method of planarizing $SiO_2$ containing dielectric in semiconductor wafer processing comprises the following steps:

providing a layer of undoped $SiO_2$ atop a wafer;

depositing a layer of doped $SiO_2$ atop the layer of undoped $SiO_2$;

chemical mechanical polishing the doped $SiO_2$ layer using a slurry composition which provides significant selectivity to the underlying layer of undoped $SiO_2$ and using the underlying layer of undoped $SiO_2$ as an effective chemical mechanical polishing end-point etch stop to prevent further etching of the doped $SiO_2$ and produce a substantially planar upper wafer surface of dielectric, the slurry composition having a pH from about 9 to about 12 and having a solids concentration of from about 1% to 10% by weight.

Figure 1:
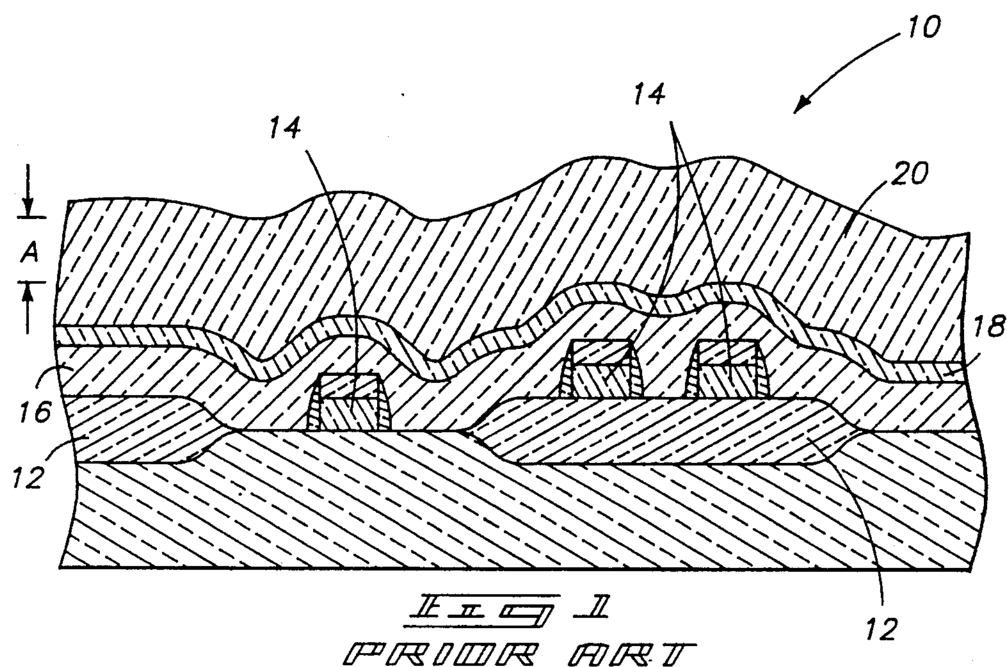
FIG. 1 is a diagrammatic section of a wafer fragment discussed in the "Background" section above.
Figure 2:
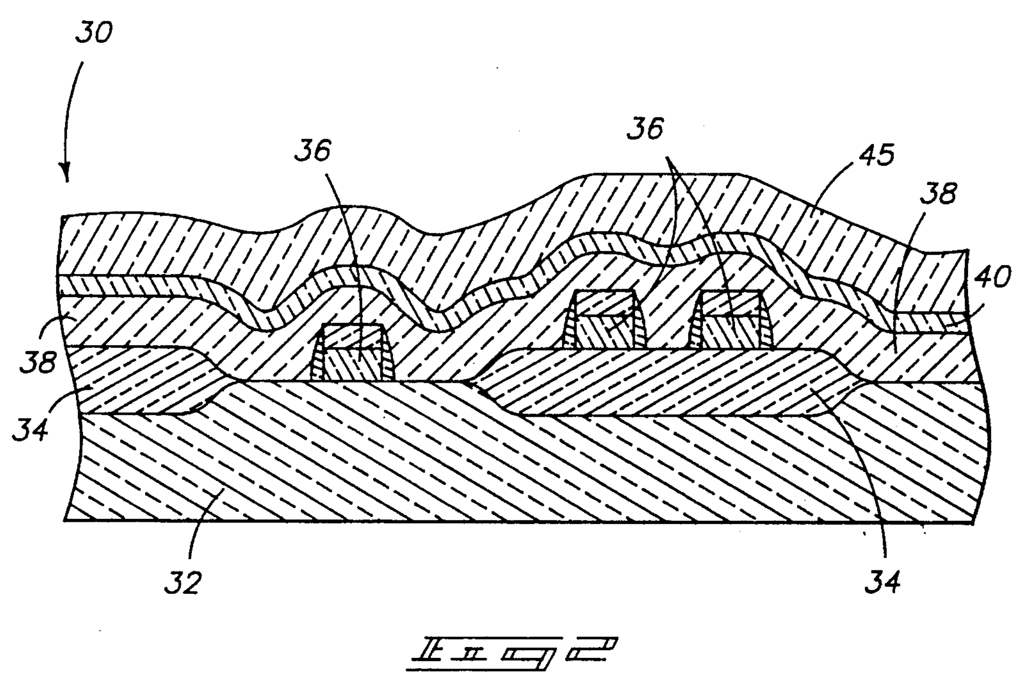
FIG. 2 is a diagrammatic section of a partially processed wafer fragment processed in accordance with the invention.

The discussion proceeds with reference to FIG. 2. There illustrated is a wafer fragment 30 comprised of a bulk substrate 32, field oxide regions 34, and polysilicon containing conductive runners 36. A first isolating layer of dielectric 38 is applied over the wafer and poly runners 36. An interlevel layer 40 of conductively doped polysilicon is applied atop layer 38.

A layer 45 of undoped $SiO_2$ is provided atop layer 40. Layer 45 is preferably provided to a thickness of at least 2000 Angstroms. A preferred deposition technique includes decomposition of tetraethyl orthosiliate (TEOS) to produce an undoped layer of $SiO_2$.

Figure 3:
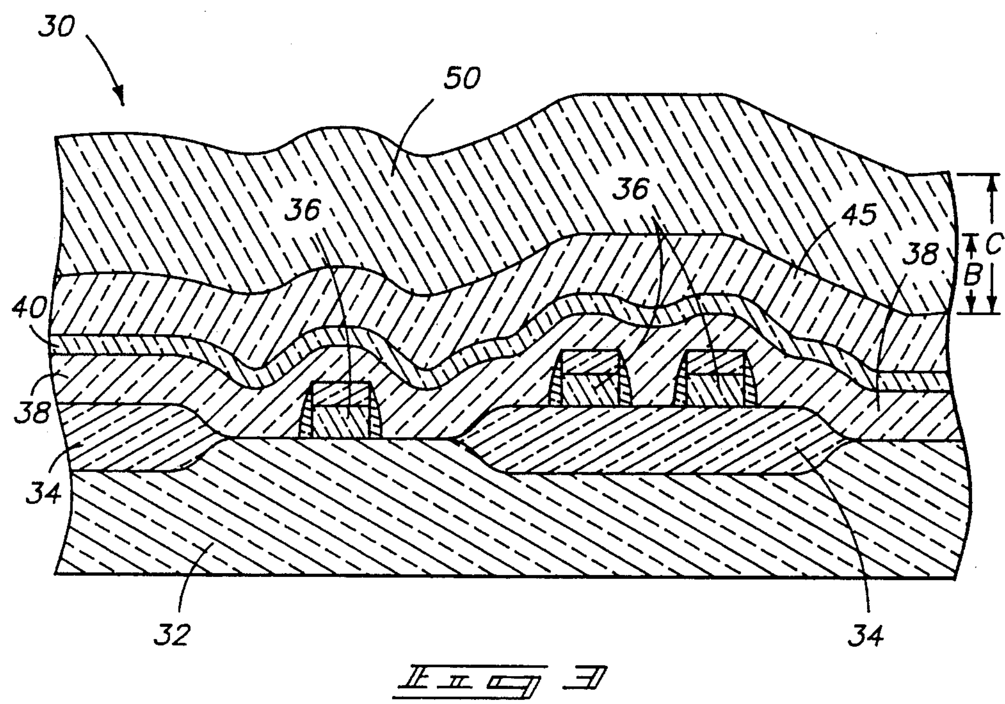
FIG. 3 is a diagrammatic section of the FIG. 2 wafer fragment shown at a processing step subsequent to that illustrated by FIG. 2.

Referring to FIG. 3, a layer 50 of doped $SiO_2$ is deposited atop layer 50. Layer 50 preferably comprises BPSG. It is applied to a thickness "C" which is greater than a distance "B" between the highest and lowest elevations of layer 45.

Figure 4:
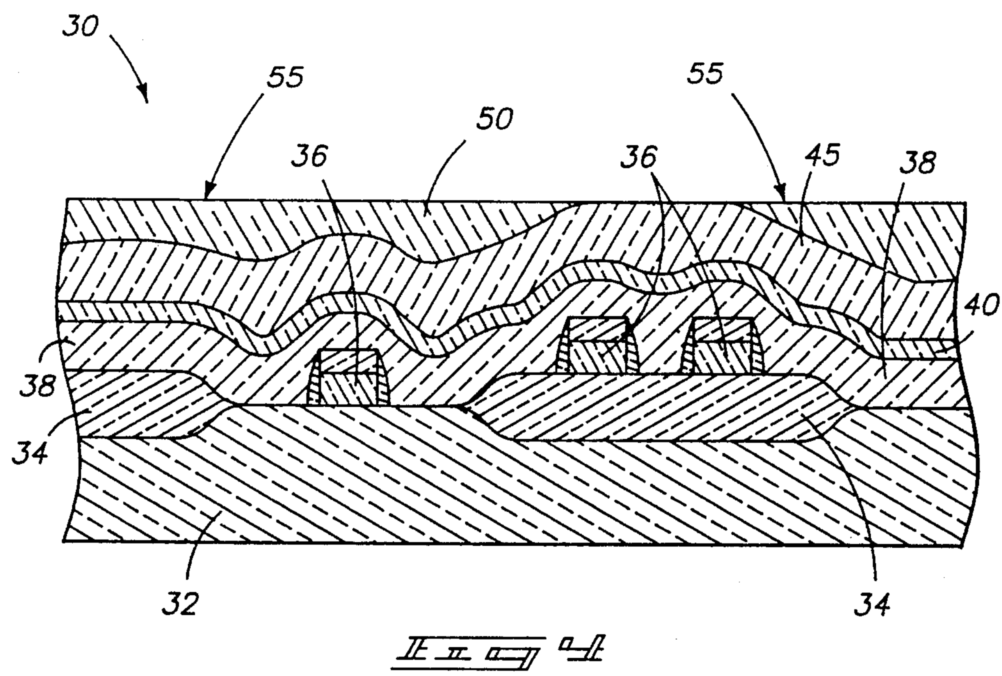
FIG. 4 is a diagrammatic section of the FIG. 2 wafer fragment shown at a processing step subsequent to that illustrated by FIG. 3.

Referring to FIG. 4, doped $SiO_2$ layer 50 (BPSG) is chemical mechanical polished selectively relative to underlying layer 45 of undoped $SiO_2$ using undoped $SiO_2$ layer 45 as an effective chemical mechanical polishing end-point etch stop. This prevents further etching of doped $SiO_2$ and produces a substantially planar upper wafer surface 55 of dielectric.

The invention was reduced to practice using a commercially available colloidal silica slurry solution, a model SC-1 available from the Cabot Company, of P.O. Box 188, Tuscola, IL 61953. Such is understood to comprise primarily KOH, water and suspended $SiO_2$ particles having an average diameter of approximately 250 Angstroms. The slurry as purchased has a pH of about 8.5, and an $SiO_2$ concentration of 30% by weight. Under conditions of 135° F. and 5 psi, an etch rate of approximately 2400 Angstroms per minute BPSG to 800 Angstroms per minute undoped oxide was obtained, providing an effective selectivity of 3:1. Of course, alternate slurry compositions could be utilized without departing from the principles and scope of the invention.

Preferred slurry conditions (whether a $KOH/SiO_2$ composition, or some other composition) are expected to range from 1% to 20% by weight solid concentration, with a pH from about 7 to about 12. More preferred is a slurry composition having a pH from about 9 to about 12 and having a solids concentration of from about 1% to about 10% by weight. Slurry particle size is preferably of an average maximum diameter of from about 100 Angstroms to about 500 Angstroms. Most preferably, the slurry solids concentration is about 5%, with the most preferred pH being about 10. A wafer as illustrated in FIG. 3 having an approximate 4000 Angstrom thick layer 45 of TEOS and a 24,000 Angstrom thick layer 50 of BPSG (3% B, 6% P) using the most preferred chemistry including KOH and $SiO_2$ under conditions of 135° F. and 5 psi for 3 minutes produced a selectivity of 5:1, and the profile illustrated by FIG. 4.

In compliance with the statute, the invention has been described in language more or less specific as to structural and methodical features. It is to be understood, however, that the invention is not limited to the specific features shown and described, since the means and construction herein disclosed comprise preferred forms of putting the invention into effect. The invention is, therefore, claimed in any of its forms or modifications within the proper scope of the appended claims appropriately interpreted in accordance with the doctrine of equivalents.

I claim:

1. A method of planarizing $SiO_2$ containing dielectric in semiconductor wafer processing comprising the following steps:

providing a layer of undoped $SiO_2$ atop a wafer;

depositing a layer of borophosphosilicate glass atop the layer of undoped $SiO_2$;

chemical mechanical polishing the borophosphosilicate glass layer using a slurry composition which provides significant selectivity to the underlying layer of undoped $SiO_2$ and using the layer of undoped $SiO_2$ as an effective chemical mechanical polishing end-point etch stop to prevent further etching of the borophosphosilicate glass and produce a substantially planar upper wafer surface of dielectric, the slurry composition having a pH from about 7 to about 12 and having a solids concentration of from about 1% to 20% by weight.

2. The method of planarizing $SiO_2$ containing dielectric of claim 1 wherein the slurry has a solution component and a solids component, the solution component comprising KOH and water, the solids component comprising $SiO_2$ particles having an average maximum diameter of from about 100 Angstroms to about 500 Angstroms.

3. The method of planarizing $SiO_2$ containing dielectric of claim 1 comprising providing the layer of undoped $SiO_2$ to a thickness of at least 2000 Angstroms.

4. The method of planarizing $SiO_2$ containing dielectric of claim 1 comprising depositing the layer of undoped $SiO_2$ by decomposition of tetraethyl orthosilicate.

5. The method of planarizing $SiO_2$ containing dielectric of claim 1 comprising depositing the layer of undoped $SiO_2$ by decomposition of tetraethyl orthosilicate to a thickness of at least 2000 Angstroms.

6. The method of planarizing $SiO_2$ containing dielectric of claim 1 comprising:

providing the layer of undoped $SiO_2$ to a thickness of at least 2000 Angstroms; and the slurry has a solution component and a solids component, the solution component comprising KOH and water, the solids component comprising $SiO_2$ particles having an average maximum diameter of from about 100 Angstroms to about 500 Angstroms.

7. The method of planarizing $SiO_2$ containing dielectric of claim 1 comprising:

depositing the layer of undoped $SiO_2$ by decomposition of tetraethyl orthosilicate to a thickness of at least 2000 Angstroms; and the slurry has a solution component and a solids component, the solution component comprising KOH and water, the solids component comprising $SiO_2$ particles having an average maximum diameter of from about 100 Angstroms to about 500 Angstroms.

* * * * *